(12) United States Patent
Chang et al.

(10) Patent No.: US 10,903,198 B2
(45) Date of Patent: *Jan. 26, 2021

(54) SEMICONDUCTOR PACKAGE ASSEMBLY AND METHOD FOR FORMING THE SAME

(71) Applicant: MEDIATEK INC., Hsinchu (TW)

(72) Inventors: Chia-Cheng Chang, Hsin-Chu (TW); I-Hsuan Peng, Hsin-Chu (TW); Tzu-Hung Lin, Hsin-Chu (TW)

(73) Assignee: MEDIATEK INC, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/674,298

(22) Filed: Nov. 5, 2019

(65) Prior Publication Data

US 2020/0075572 A1  Mar. 5, 2020

Related U.S. Application Data

(63) Continuation of application No. 16/043,326, filed on Jul. 24, 2018, now Pat. No. 10,497,689.

(Continued)

(51) Int. Cl.
*H01L 25/18* (2006.01)
*H01L 21/78* (2006.01)
(Continued)

(52) U.S. Cl.
CPC .............. *H01L 25/18* (2013.01); *H01L 21/78* (2013.01); *H01L 24/32* (2013.01); *H01L 24/48* (2013.01);
(Continued)

(58) Field of Classification Search
CPC ..... H01L 25/18; H01L 25/0655; H01L 24/32; H01L 21/78; H01L 25/50; H01L 24/49; H01L 24/48; H01L 2224/32137; H01L 24/29; H01L 2224/32106; H01L 24/13; H01L 2224/48227; H01L 2924/15311;
(Continued)

(56) References Cited

U.S. PATENT DOCUMENTS 8,508,046 B2  8/2013  Sakuma et al.
9,245,773 B2  1/2016  Lin et al.
(Continued)

FOREIGN PATENT DOCUMENTS

CN  102484101 A  5/2012
JP  63308344 A  12/1988
(Continued)

*Primary Examiner* — David Vu
(74) *Attorney, Agent, or Firm* — McClure, Qualey & Rodack, LLP

(57) ABSTRACT

A semiconductor package assembly and method for forming the same are provided. The semiconductor package assembly includes a first semiconductor die and a second semiconductor die disposed on a first surface of a substrate. The first semiconductor die includes a peripheral region having a second edge facing the first edge of the second semiconductor die and a third edge opposite to the second edge, a circuit region surrounded by the peripheral region, wherein the circuit region has a fourth edge adjacent to the second edge and a fifth edge adjacent to the third edge. A minimum distance between the second edge and the fourth edge is a first distance, a minimum distance between the third edge and the fifth edge is a second distance, and the first distance is different from the second distance.

20 Claims, 6 Drawing Sheets

Related U.S. Application Data

(60) Provisional application No. 62/549,015, filed on Aug. 23, 2017, provisional application No. 62/541,199, filed on Aug. 4, 2017.

(51) Int. Cl.
  *H01L 25/00* (2006.01)
  *H01L 23/00* (2006.01)
  *H01L 25/065* (2006.01)
  *H01L 23/538* (2006.01)

(52) U.S. Cl.
  CPC .......... *H01L 24/49* (2013.01); *H01L 25/0655* (2013.01); *H01L 25/50* (2013.01); H01L 23/5384 (2013.01); H01L 24/13 (2013.01); H01L 24/16 (2013.01); H01L 24/29 (2013.01); H01L 2224/16227 (2013.01); H01L 2224/16235 (2013.01); H01L 2224/32106 (2013.01); H01L 2224/32137 (2013.01); H01L 2224/32225 (2013.01); H01L 2224/48011 (2013.01); H01L 2224/48227 (2013.01); H01L 2224/49175 (2013.01); H01L 2224/49176 (2013.01); H01L 2924/1431 (2013.01); H01L 2924/1432 (2013.01); H01L 2924/1436 (2013.01); H01L 2924/15311 (2013.01)

(58) Field of Classification Search
  CPC ....... H01L 23/5384; H01L 2224/49176; H01L 2224/16227; H01L 2224/32225; H01L 2224/16235; H01L 2224/48011; H01L 2924/1431; H01L 2924/1432; H01L 2924/1436; H01L 24/16; H01L 2224/49175; H01L 2924/18161; H01L 2224/73204; H01L 2224/16225; H01L 23/535; H01L 24/83; H01L 24/97; H01L 2224/832
  See application file for complete search history.

(56) References Cited

U.S. PATENT DOCUMENTS

| | | |
|---|---|---|
| 2008/0061338 A1 | 3/2008 | Lattard et al. |
| 2013/0200529 A1 | 8/2013 | Lin et al. |
| 2015/0255426 A1 | 9/2015 | Son et al. |

FOREIGN PATENT DOCUMENTS

| | | |
|---|---|---|
| WO | 2011/019080 A1 | 2/2011 |
| WO | 2014045989 A1 | 3/2014 |

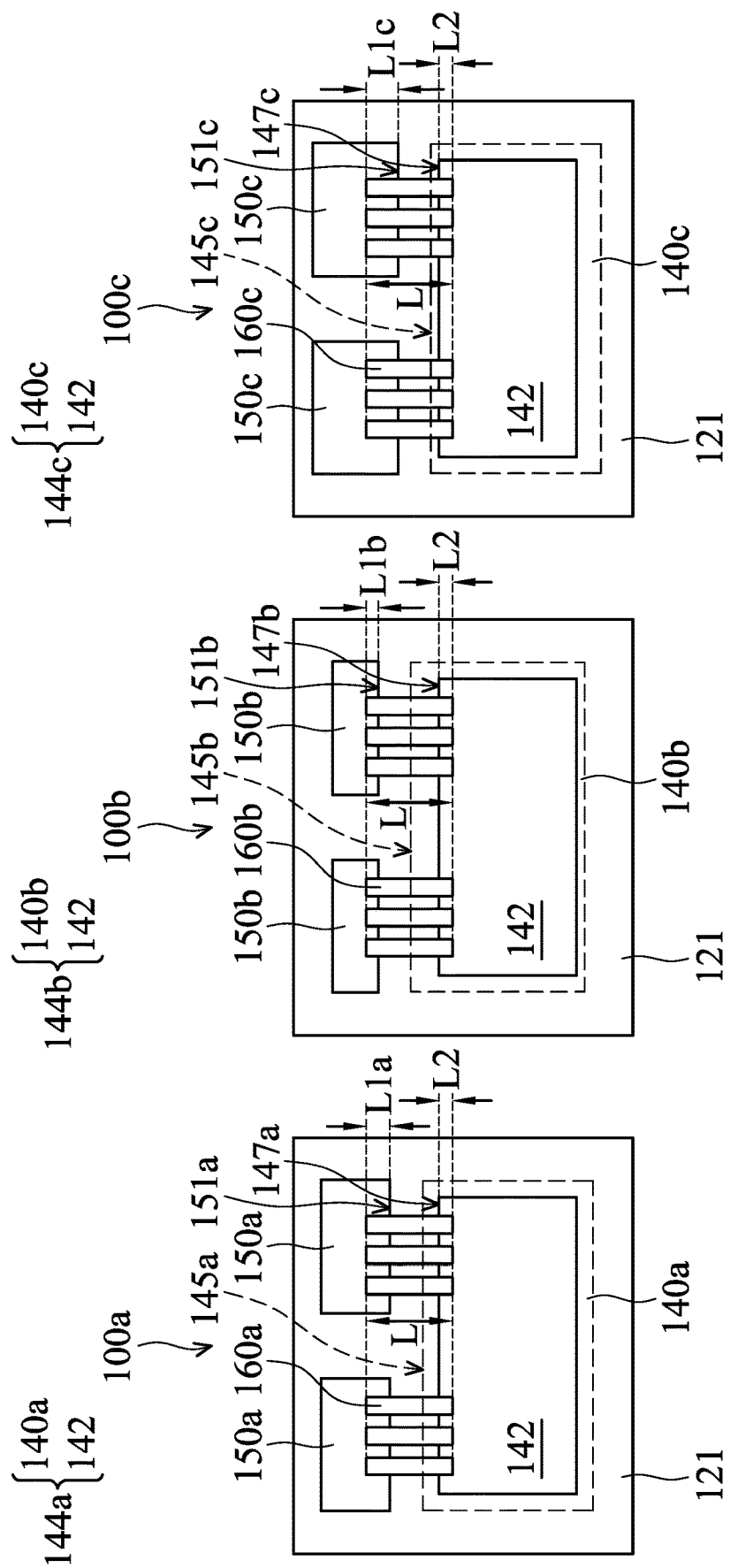

SEMICONDUCTOR PACKAGE ASSEMBLY AND METHOD FOR FORMING THE SAME

CROSS REFERENCE TO RELATED APPLICATIONS

This application is a Continuation application of U.S. application Ser. No. 16/043,326, filed on Jul. 24, 2018, now U.S. Pat. No. 10,497,689, which claims the benefit of U.S. Provisional Application No. 62/541,199 filed on Aug. 4, 2017 and U.S. Provisional Application No. 62/549,015 filed on Aug. 23, 2017, the entirety of which are incorporated by reference herein.

BACKGROUND OF THE INVENTION

Field of the Invention

The present invention relates to a semiconductor package assembly, and in particular to a semiconductor package assembly with horizontally discrete semiconductor dies and memory dies.

Description of the Related Art

A semiconductor package assembly can not only provide a semiconductor die with protection from environmental contaminants, but it can also provide an electrical connection between the semiconductor die packaged therein and a substrate, such as a printed circuit board (PCB). For instance, a semiconductor die may be enclosed in an encapsulating material, and traces are electrically connected to the semiconductor die and the substrate.

In high-level packaging technology, a memory die can be horizontally packaged with a semiconductor die in the semiconductor package assembly, and the semiconductor package assembly can provide an electrical connection between the semiconductor die and the memory die. However, a problem with such a semiconductor package assembly is that there are so many different sizes of memory dies on the market. It is necessary to design different layouts for semiconductor package assemblies using memory dies of different sizes, and this can lead to the rising cost of manufacturing these semiconductor package assemblies.

Therefore, a novel semiconductor package assembly and methods for forming the same are desirable.

BRIEF SUMMARY OF THE INVENTION

Semiconductor package assemblies are provided. An exemplary embodiment of a semiconductor package assembly includes a first semiconductor die and a second semiconductor die disposed on a first surface of a substrate, wherein the second semiconductor die comprises a first edge facing the first semiconductor die, and the first semiconductor die comprises: a peripheral region having a second edge facing the first edge of the second semiconductor die and a third edge opposite to the second edge; and a circuit region surrounded by the peripheral region, wherein the circuit region has a fourth edge adjacent to the second edge and a fifth edge adjacent to the third edge, and wherein a minimum distance between the second edge and the fourth edge is a first distance, a minimum distance between the third edge and the fifth edge is a second distance, and the first distance is different from the second distance. a semiconductor die and a first memory die disposed on a first surface of a substrate, wherein the first memory die comprises a first edge facing the semiconductor die.

Another exemplary embodiment of a semiconductor package assembly includes a first semiconductor die and a second semiconductor die disposed on a first surface of an interposer, wherein the first semiconductor die comprises: a peripheral region having a first edge facing the second semiconductor die and a second edge opposite to the first edge; and a circuit region surrounded by the peripheral region, wherein the circuit region has a third edge adjacent to the second semiconductor die and a fourth edge opposite to the third edge, wherein a first distance between the first edge and the third edge is different from a second distance between the second edge and the fourth edge, and wherein a third distance between the first edge and the second edge is greater than a fourth distance between the third edge and the fourth edge.

An exemplary embodiment of a method for forming a semiconductor package assembly includes performing a dicing process along a first scribe line of a wafer to separate a first circuit region from a second circuit region, wherein the first circuit region has a first edge adjacent to a second edge of the second circuit region, and a first distance between the first edge and the first scribe line is different from a second distance between the second edge and the first scribe line; forming a first semiconductor die having the first circuit region after performing the dicing process; and bonding the first semiconductor die and a second semiconductor die to a first surface of a substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 1 is a cross-sectional view of the semiconductor package assembly along line 1-1' of FIG. 3B;

FIG. 4A is a top view of a comparative semiconductor package assembly;

FIG. 4B is a top view of a semiconductor package assembly, in accordance with some embodiments of the disclosure;

FIG. 4C is a top view of a semiconductor package assembly, in accordance with some other embodiments of the disclosure;

DETAILED DESCRIPTION OF THE INVENTION

Figure 1:
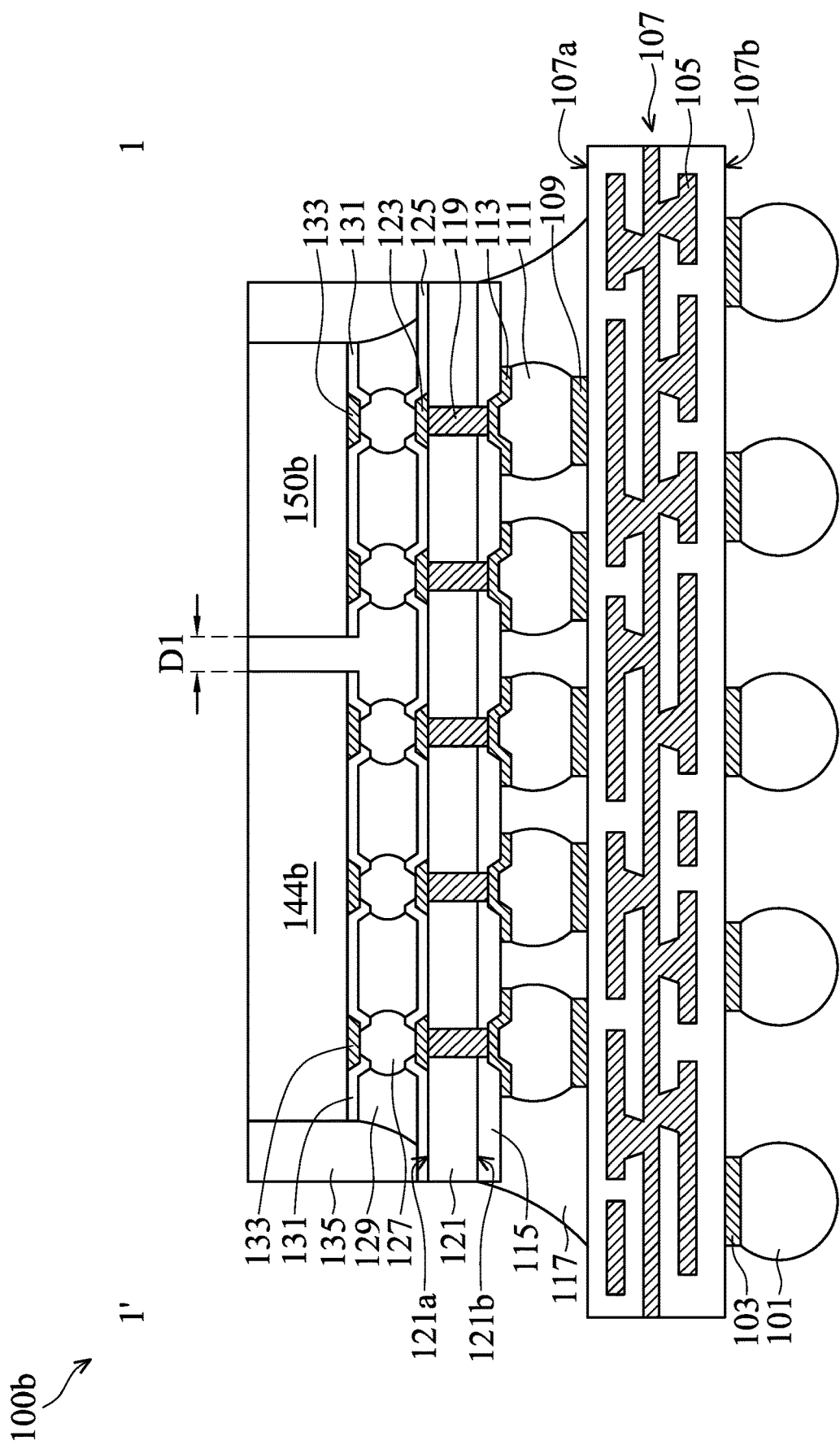
FIG. 1 is a cross-sectional view of a semiconductor package assembly, in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a cross-sectional view of a semiconductor package assembly 100b, in accordance with some embodiments of the disclosure. Additional features can be added to the semiconductor package structure 100b. Some of the features described below can be replaced or eliminated for different embodiments. To simplify the diagram, only a portion of the semiconductor package assembly 100b is depicted in FIG. 1. In some embodiments, the semiconductor package assembly 100b may include a wafer-level semiconductor package, for example, a flip-chip semiconductor package.

Referring to FIG. 1, the semiconductor package assembly 100b includes a base 107. The base 107 may be a printed circuit board (PCB) and may be formed of polypropylene (PP). It should also be noted that the base 107 can be a single layer or a multilayer structure, and the base 107 may include a redistribution layer (RDL) structure 105 therein. The base 107 has a first surface 107a and a second surface 107b opposite thereto. A plurality of conductive pads 109 is disposed on the first surface 107a, and a plurality of conductive pads 103 is disposed on the second surface 107b. In some embodiments, the conductive pads 103 and the conductive pads 109 may be conductive traces, and the conductive traces may comprise power segments, signal trace segments or ground trace segments, which are used for the input/output (I/O) connections of the semiconductor package assembly 100b.

Moreover, the semiconductor package assembly 100b includes a plurality of conductive structures 111 bonded onto the first surface 107a and a plurality of conductive structures 101 bonded onto the second surface 107b of the base 107. The conductive pads 103 are disposed between the conductive structures 101 and the base 107, and the conductive pads 109 are disposed between the conductive structures 111 and the base 107. In some embodiments, the conductive structures 101 may be conductive ball structures, such as ball grid array (BGA), conductive pillar structures, or conductive paste structures, and the conductive structures 111 may be controlled collapse chip connection (C4) structures.

As shown in FIG. 1, the semiconductor package assembly 100b includes a substrate 121. The substrate 121 has a first surface 121a and a second surface 121b opposite thereto, and the semiconductor package assembly 100b also includes a plurality of conductive vias 119 penetrating from the first surface 121a to the second surface 121b of the substrate 121.

In some embodiments, the substrate 121 may be an interposer, and the conductive vias 119 may be through interposer vias (TIVs).

However, embodiments of the disclosure are not limited thereto. In some other embodiments, the substrate 121 may have a wiring structure therein. For example, the wiring structure in the substrate 121 may be a fan-out structure, and may include one or more conductive pads, conductive vias, conductive layers and conductive pillars. In such cases, the wiring structure in the substrate 121 may be disposed in one or more inter-metal dielectric (IMD) layers. In some embodiments, the IMD layers may be formed of organic materials, which include a polymer base material, non-organic materials, which include silicon nitride ($SiN_x$), silicon oxide ($SiO_x$), grapheme, or the like. For example, the IMD layers are made of a polymer base material. It should be noted that the number and configuration of the IMD layers, the conductive pads, the conductive vias, the conductive layers and the conductive pillars shown in Figures are only some examples and are not limitations to the present disclosure.

In addition, a passivation layer 115 is disposed on the second surface 121b of the substrate 121, and the passivation layer 115 is penetrated by the conductive vias 119. In some embodiments, a plurality of under-bump metallurgy (UBM) layers 113 is interposed between the conductive structures 111 are the passivation layer 115. The substrate 121 is electrically connected to the base 107 through the UBM layers 113, the conductive structures 111 and the conductive pads 109. Each of the UBM layers 113 may include one or more layers, such as a barrier layer and a seed layer. The UBM layers 113 including a single layer are depicted herein as an example. Moreover, the conductive structures 111 are surrounded by an underfill layer 117 that is interposed between the first surface 107a of the base 107 and the passivation layer 115.

Still referring to FIG. 1, the semiconductor package assembly 100b includes a plurality of conductive pads 123 and a dielectric layer 125 disposed on the first surface 121a of the substrate 121. In some embodiments, the dielectric layer 125 extends on the conductive pads 123, and a portion of the conductive pads 123 are exposed by the dielectric layer 125.

Moreover, the semiconductor package assembly 100b also includes a semiconductor die 144b and a memory die 150b. The semiconductor die 144b and the memory die 150b are bonded to the first surface 121a of the substrate 121 through a plurality of conductive structures 127. In some embodiments, the semiconductor die 144b may be a system-on-chip (SOC), such as a logic die including a central processing unit (CPU), a graphics processing unit (GPU) or any combination thereof. In some embodiments, the memory die 150b may be a hybrid dynamic random access memory (DRAM) die, such as a high bandwidth memory (HBM) die.

In some embodiments, both the semiconductor die 144b and the memory die 150b have a plurality of conductive pads 133 and a dielectric layer 131 thereon, the dielectric layer 131 extends on the conductive pads 133, and a portion of the conductive pads 133 is exposed by the dielectric layer 131. The semiconductor die 144b and the memory die 150b are electrically connected to the substrate 121 through the conductive pads 133, the conductive structures 127 and the conductive pads 123. In some embodiments, the conductive structures 127 are surrounded by an underfill layer 129, and the underfill layer 129 is interposed between the semiconductor die 144*b*, the memory die 150*b* and the dielectric layer 125 on the first surface 121*a* of the substrate 121.

It should be noted that the semiconductor die 144*b* and the memory die 150*b* are separated by a portion of the underfill layer 129, and the semiconductor die 144*b* and the memory die 150*b* have a distance D1 between them. Moreover, a molding compound 135 is disposed on the dielectric layer 125. The underfill layer 129, the semiconductor die 144*b* and the memory die 150*b* are surrounded by the molding compound 135. That is, as shown in FIG. 1, the edges of the semiconductor die 144*b* and the memory die 150*b* away from each other are covered by the molding compound 135. The top surfaces of the semiconductor die 144*b* and the memory die 150*b* are coplanar with the top surfaces of the molding compound 135 and the underfill layer 129.

In some embodiments, the molding compound 135 may be formed of a nonconductive material, such as an epoxy, a resin, a moldable polymer, or the like. The molding compound 312 may be applied while substantially liquid, and then may be cured through a chemical reaction, such as in an epoxy or resin.

Figure 2:
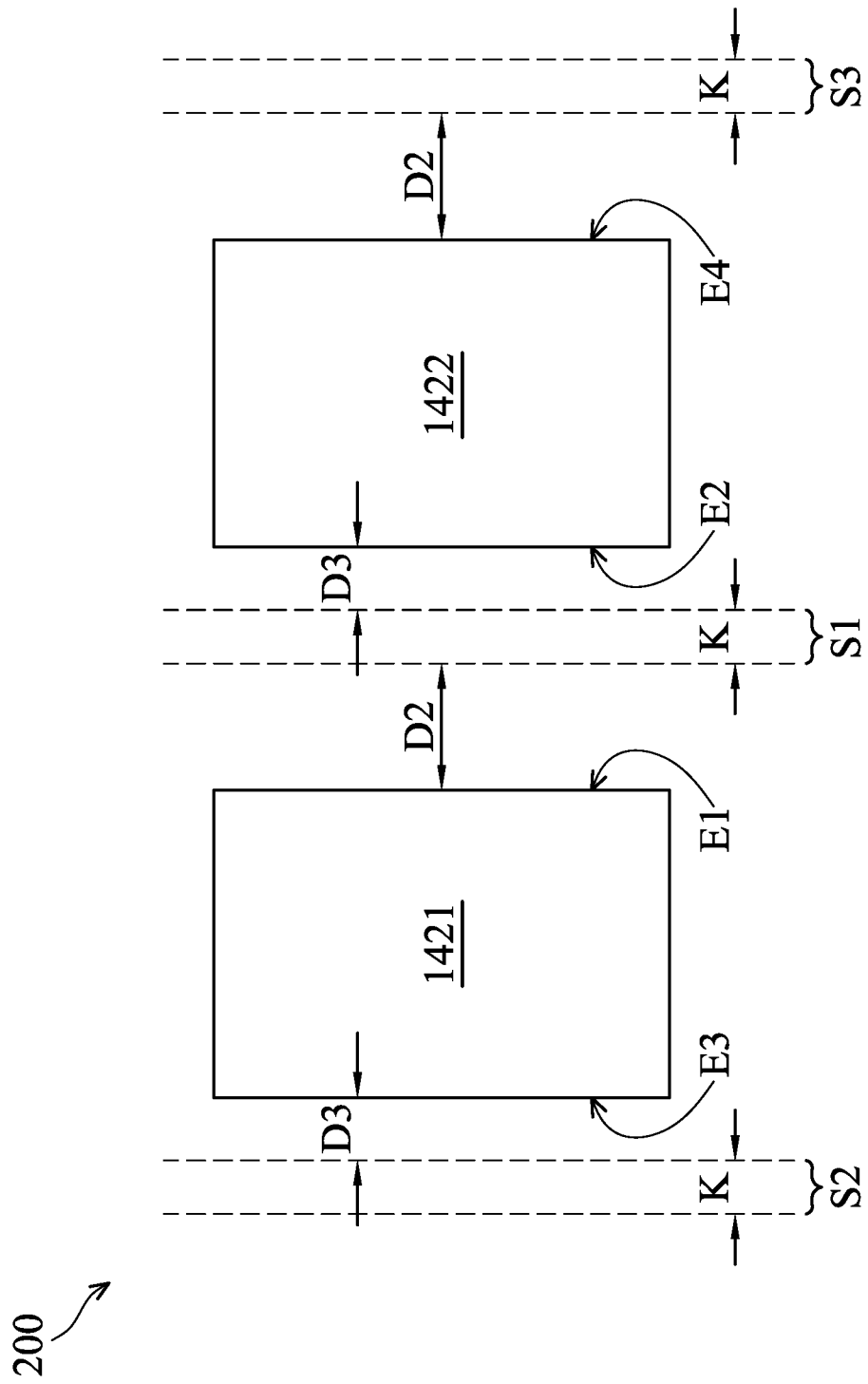
FIG. 2 is a top view of a wafer showing a method for forming semiconductor dies, in accordance with some embodiments of the disclosure.

FIG. 2 is a top view of a wafer 200 showing a method for forming semiconductor dies, in accordance with some embodiments of the disclosure.

Since there are so many different sizes of memory dies on the market, it is necessary to design different layouts for semiconductor package assemblies using memory dies of different sizes, and this can lead to the rising cost of manufacturing these semiconductor package assemblies. In order to solve this problem, the dicing process performed on the wafer to form the semiconductor dies can be modified. Specifically, the locations of the scribe lines on the wafer can be adjusted, so that the dicing margins at opposite sides of each of the semiconductor dies (i.e. opposite sides of each of the circuit regions) are different.

As shown in FIG. 2, to simplify the diagram, only two adjacent circuit regions 142<sub>1</sub> and 142<sub>2</sub>, and three scribe lines S1, S2 and S3 on the wafer 200 are depicted. The three scribe lines S1, S2 and S3 are parallel to each other. The scribe lines S1 and S2 are located at opposite sides of the circuit region 142<sub>1</sub>, the scribe lines S1 and S3 are located at opposite sides of the circuit region 142<sub>2</sub>, and the scribe line S1 is between the circuit regions 142<sub>1</sub> and 142<sub>2</sub>.

In some embodiments, the scribe lines S1, S2 and S3 have the same width K. The circuit region 142<sub>1</sub> has a first edge E1 adjacent to the scribe line S1, and the circuit region 142<sub>2</sub> has a second edge E2 adjacent to the scribe line S1. A third edge E3 of the circuit region 142<sub>1</sub> opposite to the first edge E1 is adjacent to the scribe line S2, and a fourth edge E4 of the circuit region 142<sub>2</sub> opposite to the second edge E2 is adjacent to the scribe line S3.

It should be noted that the first edge E1 and the scribe line S1 have a distance D2 between them, the second edge E2 and the scribe line S1 have a distance D3 between them, and the distance D2 is different from the distance D3. Moreover, the third edge E3 and the scribe line S2 have the distance D3 between them, and the fourth edge E4 and the scribe line S3 have the distance D2 between them.

The region between the first edge E1 and the scribe line S1, and the region between the third edge E3 and the scribe line S2 are the dicing margins of the subsequently formed semiconductor die having the circuit region 142<sub>1</sub>. The region between the second edge E2 and the scribe line S1, and the region between the fourth edge E4 and the scribe line S3 are the dicing margins of the subsequently formed semiconductor die having the circuit region 142<sub>2</sub>.

After performing the dicing process, the circuit region 142<sub>1</sub> is separated from the circuit region 142<sub>2</sub>. The circuit region 142<sub>1</sub> and the peripheral region of the wafer 200 surrounding the circuit region 142<sub>1</sub> (i.e. the dicing margin) constitute a semiconductor die, and the circuit region 142<sub>2</sub> and the peripheral region of the wafer 200 surrounding the circuit region 142<sub>2</sub> (i.e. the dicing margin) constitute another semiconductor die. In some embodiments, the peripheral regions have no circuit therein, they are dicing margins for forming the semiconductor dies.

The semiconductor die with the circuit region 142<sub>1</sub> and the semiconductor die with the circuit region 142<sub>2</sub> may be horizontally packaged with the memory die 150*b* as shown in FIG. 1. That is, the semiconductor die with the circuit region 142<sub>1</sub> and the semiconductor die with the circuit region 142<sub>2</sub> may be similar to, or the same as, the semiconductor die 144*b* of FIG. 1. It should be noted that the circuit regions 142<sub>1</sub> and 142<sub>2</sub> are completely surrounded by the peripheral regions, and the outer edge of the peripheral region is the physical edge of the semiconductor die, which is covered by the molding compound 135.

Figures 3A, 3B, 3C:
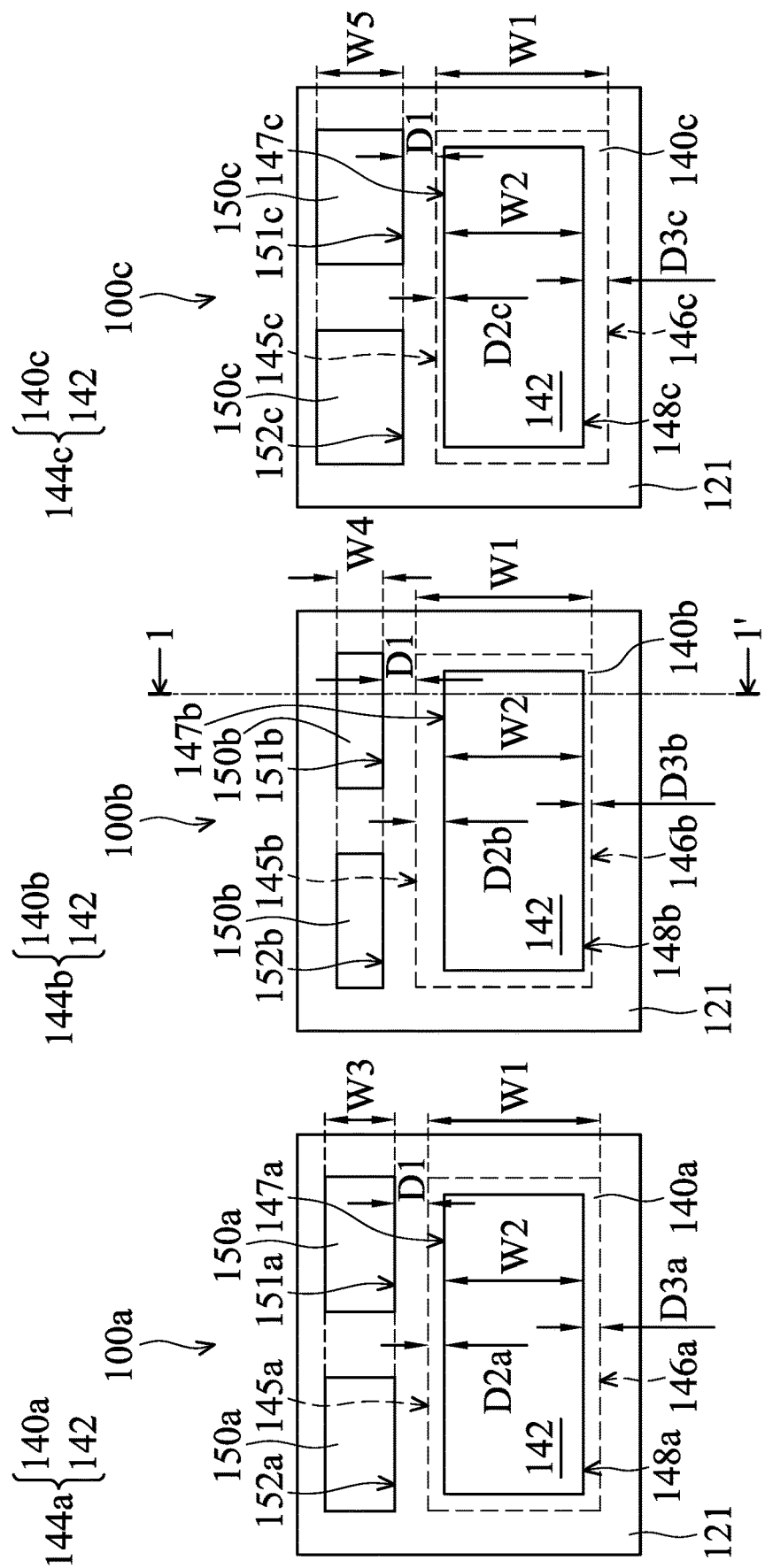
FIG. 3A is a top view of a comparative semiconductor package assembly.
FIG. 3B is a top view of a semiconductor package assembly, in accordance with some embodiments of the disclosure.
FIG. 3C is a top view of a semiconductor package assembly, in accordance with some other embodiments of the disclosure.

FIG. 3A is a top view of a comparative semiconductor package assembly 100*a*. FIG. 3B is a top view of the semiconductor package assembly 100*b*, in accordance with some embodiments of the disclosure, and FIG. 1 is a cross-sectional view of the semiconductor package assembly 100*b* along line 1-1' of FIG. 3B. FIG. 3C is a top view of a semiconductor package assembly 100*c*, in accordance with some other embodiments of the disclosure. In order to simplify the diagram, only a semiconductor die and two memory dies on the substrate 121 are depicted in each of the FIGS. 3A, 3B and 3C.

As shown in FIG. 3A, the comparative semiconductor package assembly 100*a* includes two memory dies 150*a* and a semiconductor die 144*a* disposed on the substrate 121. The memory dies 150*a*, the semiconductor die 144*a* and the substrate 121 are similar to, or the same as, the memory die 150*b*, the semiconductor die 144*b* and the substrate 121 previously described with reference to FIG. 1, and are not repeated for brevity. In addition, the two memory dies 150*a* have the same width W3.

The semiconductor die 144*a* is composed of a circuit region 142 and a peripheral region 140*a* surrounding the circuit region 142. The two memory dies 150*a* have edges 151*a* and 152*a* respectively. The semiconductor die 144*a* has an edge 145*a* facing the edges 151*a* and 152*a* of the memory dies 150*a* and an edge 146*a* opposite to the edge 145*a*. The edge 145*a* and the edge 146*a* of the semiconductor die 144*a* are physical edges, and they are also parts of the outer edge of the peripheral region 140*a*.

Moreover, the circuit region 142 has an edge 147*a* adjacent to the edge 145*a* and an edge 148*a* opposite to the edge 147*a*. The edge 148*a* of the circuit region 142 is adjacent to the edge 146*a* of the peripheral region 140*a*. In other words, the edges 147*a* and 148*a* are the parts of the interfaces between the circuit region 142 and the peripheral region 140*a*. The edge 145*a* and the edge 146*a* have a distance between them, which is defined as a width W1 of the semiconductor die 144*a*. The edge 147*a* and the edge 148*a* have a distance between them, which is defined as a width W2 of the circuit region 142. The width W1 is greater than the width W2, and the location of the width W2 is fully covered by that of the width W1.

In this embodiments, the distance D1 is between the edge 151*a* of the memory die 150*a* and the edge 145*a* of the semiconductor die 144*a*, which is the same as that shown in FIG. 1. It should be noted that the edge 145*a* and the edge 147a have a distance D2a between them, the edge 146a and the edge 148a have a distance D3a between them, and the distance D2a is the same as the distance D3a, since the dicing process for forming the semiconductor die 144a is not adjusted as that shown in FIG. 2. That is, the peripheral region 142 is located at the center of the semiconductor die 144a.

However, if the size of the memory dies 150a are changed, the layout of the semiconductor package assembly 100a will need to be changed accordingly, which leads to the rising costs of manufacturing the semiconductor package assembly 100a.

In order to solve the aforementioned problem, a semiconductor die 144b formed by the dicing process as shown in FIG. 2 is provided. Referring to FIG. 3B, two memory dies 150b, which have size smaller than that of the memory dies 150a of FIG. 3A, and a semiconductor die 144b are disposed on the substrate 121 of the semiconductor package assembly 100b.

Specifically, the two memory dies 150b have the same width W4, and the width W4 is smaller than the width W3 of FIG. 3A. The two memory dies 150b have edges 151b and 152b respectively. The semiconductor die 144b has an edge 145b facing the edges 151b and 152b of the memory dies 150b and an edge 146b opposite to the edge 145b. The distance D1 between the edge 151b and the edge 145b of the peripheral region 140b is the same as the distance D1 between the edge 152b and the edge 145b of the peripheral region 140b.

In this embodiment, in order to reduce warpage and to prevent reliability problems with the semiconductor package assembly, the distance D1 between the memory dies 150b and the semiconductor die 144b needs to be the same as the distance D1 between the memory dies 150a and the semiconductor die 144a in FIG. 3A.

Moreover, the circuit region 142 has an edge 147b adjacent to the edge 145b and an edge 148b opposite to the edge 147b. The edge 148b of the circuit region 142 is adjacent to the edge 146b of the peripheral region 140b. In other words, the edges 147b and 148b are the parts of the interfaces between the circuit region 142 and the peripheral region 140b.

The edge 145b and the edge 146b have a distance between them, which is defined as a width W1 of the semiconductor die 144b. The edge 147b and the edge 148b have a distance between them, which is defined as a width W2 of the circuit region 142. The width W1 is greater than the width W2, and the location of the width W2 is fully covered by that of the width W1. The width W1 of FIG. 3B is the same as the width W1 of FIG. 3A, and the width W2 is the same as the width W2 of FIG. 3B. However, the location of the circuit region 142 of FIG. 3B is different from that of the circuit region 142 of FIG. 3A.

Still referring to FIG. 3B, the edge 145b and the edge 147b have a distance D2b between them, the edge 146b and the edge 148b have a distance D3b between them. In order to use the same layout as the semiconductor package assembly 100a in FIG. 3A, the distance D2b between the edge 145b and the edge 147b is greater than the distance D3b between the edge 146b and the edge 148b. It should be noted that the semiconductor die 144b is formed by the dicing process in FIG. 2. Therefore, the dicing margins at opposite sides of the circuit region 142 are different. In other words, the circuit region 142 is not located at the center of the semiconductor die 144b.

To sum up, the memory dies 150b have the width W4 smaller than the width W3 of the memory dies 150a, the larger distance D2b between the physical edge 145b of the semiconductor die 144b and the edge 147b of the circuit region 142 is set to be closer to the memory dies 150b than the smaller distance D3b between the edge 146b of the semiconductor die 144b and the edge 148b of the circuit region 142. As a result, the layout of the semiconductor package assembly 100b may be in the same position of the layout of the semiconductor package assembly 100a.

In some other embodiments, as shown in FIG. 3C, two memory dies 150c, which have size greater than that of the memory dies 150a of FIG. 3A are provided. The electrical connection between the memory dies 150c, the semiconductor die 144c and the substrate 121 are similar to, or the same as, that of the memory dies 150b, the semiconductor die 144b and the substrate 121 previously described with reference to FIG. 1, and are not repeated for brevity.

Specifically, the two memory dies 150c have the same width W5, and the width W5 is greater than the width W3 of FIG. 3A. The two memory dies 150c have edges 151c and 152c respectively. The semiconductor die 144c has an edge 145c facing the edges 151c and 152c of the memory dies 150c and an edge 146c opposite to the edge 145c. The distance D1 between the edge 151c and the edge 145c of the peripheral region 140c is the same as the distance D1 between the edge 152c and the edge 145c of the peripheral region 140c.

In this embodiment, in order to reduce warpage and to prevent reliability problems with the semiconductor package assembly, the distance D1 between the memory dies 150c and the semiconductor die 144c needs to be the same as the distance D1 between the memory dies 150a and the semiconductor die 144a in FIG. 3A.

As indicated above, in order to use the same layout as the semiconductor package assembly 100a in FIG. 3A, the distance D2c between the edge 145c and the edge 147c is smaller than the distance D3c between the edge 146c and the edge 148c. It should be noted that the semiconductor die 144c is formed by the dicing process illustrated in FIG. 2. Therefore, the dicing margins at opposite sides of the circuit region 142 are different. In other words, the circuit region 142 is not located at the center of the semiconductor die 144c.

To sum up, the memory dies 150c have a width W5 that is greater than the width W3 of memory dies 150a, the smaller distance D2c between the physical edge 145c of the semiconductor die 144c and the edge 147c of the circuit region 142 is set to be closer to the memory dies 150c than the greater distance D3c between the edge 146c of the semiconductor die 144c and the edge 148c of the circuit region 142. As a result, the layout of the semiconductor package assembly 100c may be in the same position of the layout of the semiconductor package assembly 100a.

FIG. 4A is a top view of the comparative semiconductor package assembly 100a. FIG. 4B is a top view of the semiconductor package assembly 100b, in accordance with some embodiments of the disclosure. FIG. 4C is a top view of the semiconductor package assembly 100c, in accordance with some other embodiments of the disclosure. FIGS. 4A, 4B and 4C are similar to FIGS. 3A, 3B and 3C. The difference between FIGS. 4A-4C and FIGS. 3A-3C is that a plurality of conductive wires 160a, 160b and 160c are illustrated in FIGS. 4A-4C.

As shown in FIG. 4A, the conductive wires 160a are disposed on the semiconductor die 144a and the memory dies 150a, and the memory dies 150a are electrically connected to the semiconductor die 144a through the conductive wires 160a.

The six conductive wires 160a have the same length L. The length L1a is the length of the portions of the conductive wires 160a overlap the memory dies 150a, and the length L2 is the length of the portions of the conductive wires 160a overlap the circuit region 142 of the semiconductor die 144a. The conductive wires 160a extend across the edge 151a of the memory die 150a, the edge 145a of the peripheral region 140a and the edge 147a of the circuit region 142.

As shown in FIG. 4B, similar to the semiconductor package assembly 100a, the semiconductor package assembly 100b includes conductive wires 160b disposed on the semiconductor die 144b and the memory dies 150b, and the memory dies 150b are electrically connected to the semiconductor die 144b through the conductive wires 160b. Although FIG. 4B shows only six conductive wires 160b, it should be noted that there is no limitation on the number of the conductive wires 160b on the memory dies 150b and the semiconductor die 144b.

The six conductive wires 160b have the same length L. The length L1b is the length of the portions of the conductive wires 160b overlap the memory dies 150b, and the length L2 is the length of the portions of the conductive wires 160b overlap the circuit region 142 of the semiconductor die 144b. The conductive wires 160b extend across the edge 151b of the memory die 150b, the edge 145b of the peripheral region 140b and the edge 147b of the circuit region 142.

Compared with the semiconductor package assembly 100a, the length L of the conductive wires 160b is the same as that of the conductive wires 160a, and the length L2 of the portions of the conductive wires 160b overlap the circuit region 142 of the semiconductor die 144b is the same as that of the conductive wires 160a shown in FIG. 4A.

It should be noted that the size of the memory dies 150b is smaller than the size of the memory dies 150a, and the center of each of the memory dies 150b is at the same positions as the center of each of the memory dies 150a. Therefore, the length L1b of the portions of the conductive wires 160b that overlap the memory dies 150b is shorter than the length L1a of the portions of the conductive wires 160a that overlap the memory dies 150a.

As shown in FIG. 4C, similar to the semiconductor package assembly 100a, the semiconductor package assembly 100c includes conductive wires 160c disposed on the semiconductor die 144c and the memory dies 150c, and the memory dies 150c are electrically connected to the semiconductor die 144c through the conductive wires 160c.

The six conductive wires 160c have the same length L. The length L1c is the length of the portions of the conductive wires 160c that overlap the memory dies 150c, and the length L2 is the length of the portions of the conductive wires 160c overlap the circuit region 142 of the semiconductor die 144c. The conductive wires 160c extend across the edge 151c of the memory die 150c, the edge 145c of the peripheral region 140c and the edge 147c of the circuit region 142.

Compared with the semiconductor package assembly 100a, the length L of the conductive wires 160c is the same as that of the conductive wires 160a, and the length L2 of the portions of the conductive wires 160c that overlap the circuit region 142 of the semiconductor die 144c is the same as that of the conductive wires 160c shown in FIG. 4A.

It should be noted that the size of the memory dies 150c is greater than the size of the memory dies 150c, and the centers of each of the memory dies 150c are at the same positions as that of the centers of each of the memory dies 150a. Therefore, the length L1c of the portions of the conductive wires 160c overlap the memory dies 150c is greater than the length L1a of the portions of the conductive wires 160a overlap the memory dies 150a.

Moreover, although the sizes of the memory dies 150a, 150b and 150c are different from each other, the solder joints of the memory dies 150a, 150b and 150c, which are used to output signals, are located at the same positions. Therefore, the conductive wires 160b and 160c may have the same length L as that of the conductive wires 160a, and the signal performance will not decrease while using memory dies 150b and 150c having different sizes from that of the memory dies 150a.

Figure 5:
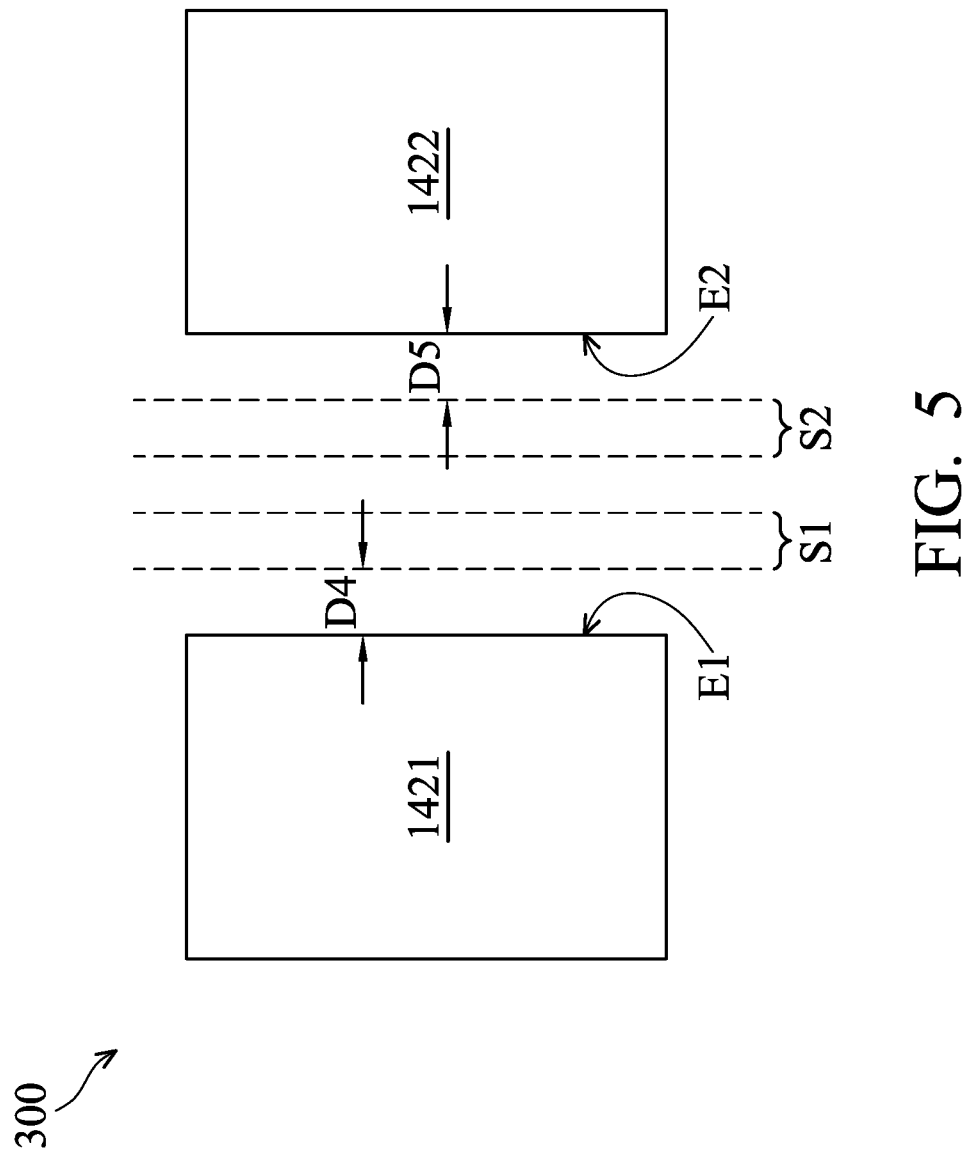
FIG. 5 is a top view of a wafer showing a method for forming semiconductor dies, in accordance with some other embodiments of the disclosure.

FIG. 5 is a top view of a wafer 300 showing a method for forming semiconductor dies, in accordance with some other embodiments of the disclosure. As shown in FIG. 5, the wafer 300 has two circuit regions 1421 and 1422, the circuit region 1421 has an edge E1 facing an edge E2 of the circuit region 1422.

The difference between the wafer 200 of FIG. 2 and the wafer 300 of FIG. 3 is that there are two scribe lines S1 and S2 between two adjacent circuit regions 1421 and 1422. Compared with the wafer 200, since there are more scribe lines between the two adjacent circuit regions 1421 and 1422, the distance D4 between the edge E1 and the scribe line S1 and the distance D5 between the edge E2 and the scribe line S2 can be adjusted more flexibly. In some embodiments, the distance D4 may be the same as the distance D5. In some other embodiments, the distance D4 may be different from the distance D5. The distance D4 and D5 may be adjusted according to the sizes of the memory dies which will be packaged with the semiconductor dies with the circuit regions 1421 and 1422 in the following process.

Figure 6B:
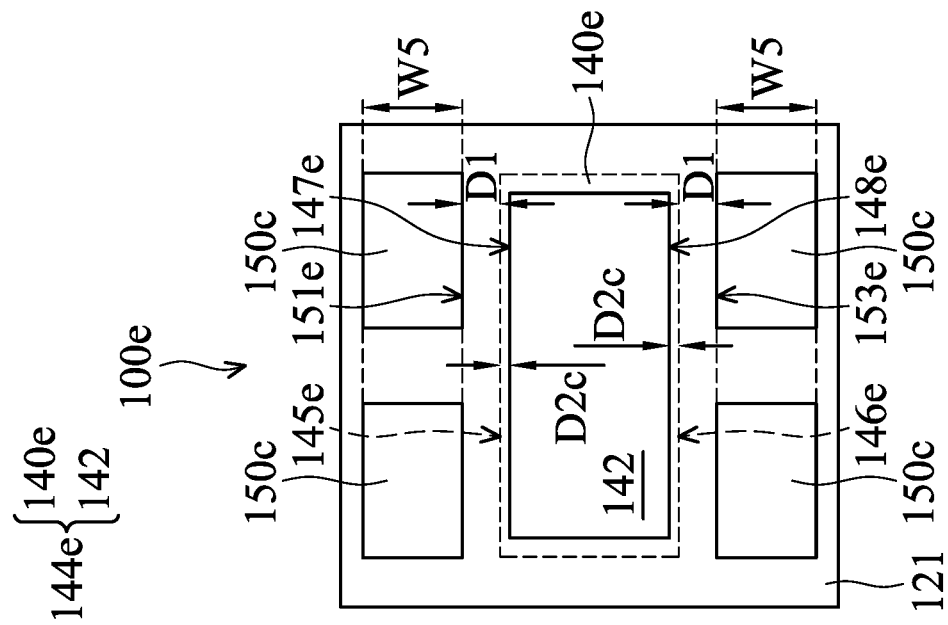
FIG. 6B is a top view of a semiconductor package assembly, in accordance with some other embodiments of the disclosure.
Figure 6A:
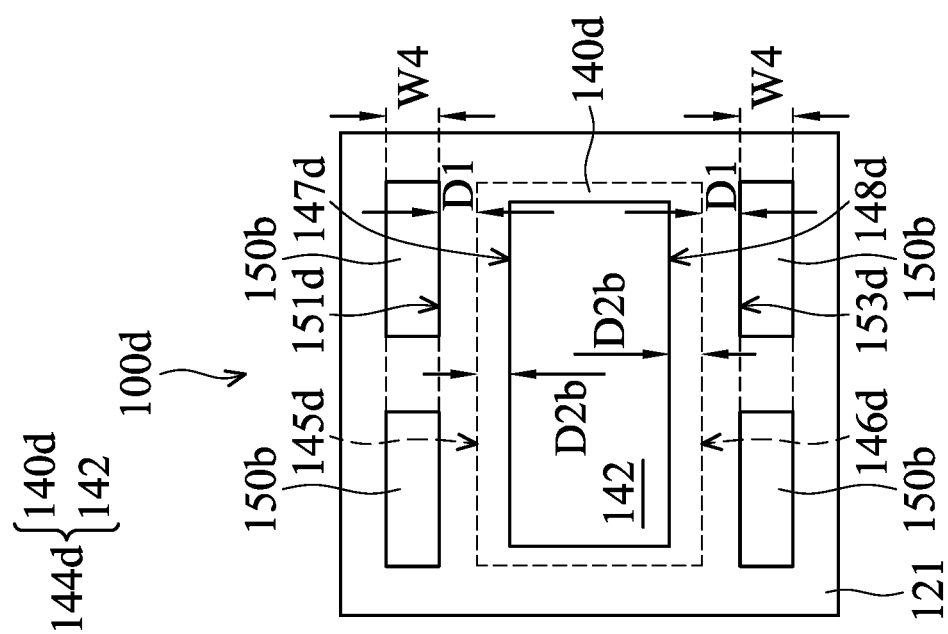
FIG. 6A is a top view of a semiconductor package assembly, in accordance with some embodiments of the disclosure.

FIG. 6A is a top view of a semiconductor package assembly 100d, in accordance with some embodiments of the disclosure. FIG. 6B is a top view of a semiconductor package assembly 100e, in accordance with some other embodiments of the disclosure.

As shown in FIG. 6A, there are four memory dies 150b and a semiconductor die 144d disposed on the substrate 121. The four memory dies 150b have the same width W4, which is the same as that of the memory dies 150b of FIG. 3B and smaller than the width W3 of the memory dies 150a of FIG. 3A. Compared with the semiconductor package assembly 100b in FIG. 3B, the semiconductor package assembly 100d further includes two memory dies 150b disposed adjacent to the edge 146d of the peripheral region 140d. That is, the memory dies 150b are disposed at opposite sides of the semiconductor dies 144d.

In this embodiment, the distance D1 between the edge 151d of the memory die 150b and the edge 145d of the peripheral region 140d is the same as the distance D1 between the edge 153d of the memory die 150b and the edge 146d of the peripheral region 140d. In addition, since the semiconductor die 144d may be formed by the dicing process shown in FIG. 5, the distance D2b between the edge 145d of the peripheral region 140d and the edge 147d of the circuit region 142 may be the same as the distance D2b between the edge 146d of the peripheral region 140d and the edge 148d of the circuit region 142.

In other embodiments, if the memory dies 150b disposed at opposite sides of the semiconductor die 144d have different sizes, the distance D2b between the edge 145d and the edge 147d may be different from the distance D2b between the edge 146d and the edge 148d.

As shown in FIG. 6B, there are four memory dies 150c and a semiconductor die 144e disposed on the substrate 121. The four memory dies 150c have the same width W5, which is the same as that of the memory dies 150c of FIG. 3C and greater than the width W3 of the memory dies 150a of FIG. 3A. Compared with the semiconductor package assembly 100c in FIG. 3C, the semiconductor package assembly 100e further includes two memory dies 150c disposed adjacent to the edge 146e of the peripheral region 140e. That is, the memory dies 150c are disposed at opposite sides of the semiconductor dies 144e.

In this embodiment, the distance D1 between the edge 151e of the memory dies 150c and the edge 145e of the peripheral region 140e is the same as the distance D1 between the edge 153e of the memory dies 150c and the edge 146e of the peripheral region 140e. In addition, since the semiconductor die 144e may be formed by the dicing process shown in FIG. 5, the distance D2c between the edge 145e of the peripheral region 140e and the edge 147e of the circuit region 142 may be the same as the distance D2c between the edge 146e of the peripheral region 140e and the edge 148e of the circuit region 142.

In other embodiments, if the memory dies 150c disposed at opposite sides of the semiconductor die 144e have different sizes, the distance D2c between the edge 145e and the edge 147e may be different from the distance D2c between the edge 146e and the edge 148e.

Since there are so many different sizes of memory dies on the market, it is necessary to design different layouts for semiconductor package assemblies using memory dies of different sizes, and this can lead to the rising cost of manufacturing these semiconductor package assemblies. According to the foregoing embodiments, the locations of the scribe lines on the wafer can be adjusted, such that the dicing margins at opposite sides of each of the semiconductor dies (i.e. opposite sides of each of the circuit regions) are different. As a result, the distances between the physical edges of the semiconductor die and the edges of the circuit region inside the semiconductor die are different at opposite sides of the circuit region. In other words, the peripheral region surrounding the circuit region has different widths at opposite sides of the circuit region, and the widths of the peripheral region may be adjusted according to the sizes of the memory dies which will be packaged with the semiconductor die in the following process.

Many variations and/or modifications can be made to embodiments of the disclosure. The semiconductor package structures in accordance with some embodiments of the disclosure can be used to form a three-dimensional (3D) package, a 2.5D package, a fan-out package, or another suitable package.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
a first semiconductor die and a second semiconductor die disposed on a first surface of a substrate, wherein the second semiconductor die comprises a first edge facing the first semiconductor die, and the first semiconductor die comprises:
a peripheral region having a second edge facing the first edge of the second semiconductor die and a third edge opposite to the second edge; and
a circuit region surrounded by the peripheral region, wherein the circuit region has a fourth edge adjacent to the second edge and a fifth edge adjacent to the third edge, and
wherein a minimum distance between the second edge and the fourth edge is a first distance, a minimum distance between the third edge and the fifth edge is a second distance, and the first distance is different from the second distance.

2. The semiconductor package assembly as claimed in claim 1, further comprising:
a third semiconductor die disposed on the first surface of the substrate, wherein a width of the second semiconductor die is the same as a width of the third semiconductor die, and the second edge is between the fourth edge and a sixth edge of the third semiconductor die.

3. The semiconductor package assembly as claimed in claim 2, wherein a minimum distance between the first edge and the second edge is the same as a minimum distance between the sixth edge and the second edge.

4. The semiconductor package assembly as claimed in claim 1, wherein the peripheral region is a dicing margin for forming the first semiconductor die.

5. The semiconductor package assembly as claimed in claim 1, further comprising:
a plurality of conductive structures disposed on the substrate, wherein the first semiconductor die and the second semiconductor die are electrically connected to the substrate through the conductive structures.

6. The semiconductor package assembly as claimed in claim 1, further comprising:
a conductive wire disposed on the first semiconductor die and the second semiconductor die, wherein the second semiconductor die is electrically connected to the first semiconductor die through the conductive wire.

7. The semiconductor package assembly as claimed in claim 6, wherein the conductive wire extends across the first edge, the second edge and the fourth edge.

8. A semiconductor package assembly, comprising:
a first semiconductor die and a second semiconductor die disposed on a first surface of an interposer, wherein the first semiconductor die comprises:
a peripheral region having a first edge facing the second semiconductor die and a second edge opposite to the first edge; and
a circuit region surrounded by the peripheral region, wherein the circuit region has a third edge adjacent to the second semiconductor die and a fourth edge opposite to the third edge,
wherein a first distance between the first edge and the third edge is different from a second distance between the second edge and the fourth edge, and
wherein a third distance between the first edge and the second edge is greater than a fourth distance between the third edge and the fourth edge.

9. The semiconductor package assembly as claimed in claim 8, further comprising:
a plurality of first conductive structures disposed on the interposer, wherein the first semiconductor die and the second semiconductor die are electrically connected to the interposer through the first conductive structures; and
a first underfill layer interposed between the first surface of the interposer, the first semiconductor die and the second semiconductor die, wherein the first conductive structures are surrounded by the first underfill layer.

10. The semiconductor package assembly as claimed in claim 9, wherein the first semiconductor die and the second semiconductor die are separated by a portion of the first underfill layer.

11. The semiconductor package assembly as claimed in claim 10, further comprising:
a molding compound surrounding the first underfill layer, the first semiconductor die and the second semiconductor die, wherein the second edge of the peripheral region of the first semiconductor die is covered by the molding compound.

12. The semiconductor package assembly as claimed in claim 8, further comprising:
a plurality of second conductive structures disposed on a second surface of the interposer, wherein the second surface is opposite to the first surface of the interposer.

13. The semiconductor package assembly as claimed in claim 12, further comprising:
a printed circuit board, wherein the second conductive structures are disposed between the printed circuit board and the interposer, and the printed circuit board is electrically connected to the interposer through the second conductive structures; and
a second underfill layer interposed between the second surface of the interposer and the printed circuit board, wherein the second conductive structures are surrounded by the second underfill layer.

14. A method for forming a semiconductor package assembly, comprising;
performing a dicing process along a first scribe line of a wafer to separate a first circuit region from a second circuit region, wherein the first circuit region has a first edge adjacent to a second edge of the second circuit region, and a first distance between the first edge and the first scribe line is different from a second distance between the second edge and the first scribe line;
forming a first semiconductor die having the first circuit region after performing the dicing process; and
bonding the first semiconductor die and a second semiconductor die to a first surface of a substrate.

15. The method as claimed in claim 14, wherein the formation of the first semiconductor die further comprises:
dicing the wafer along a second scribe line, wherein the first scribe line and the second scribe line are located at opposite sides of the first circuit region.

16. The method as claimed in claim 15, wherein the first circuit region has a third edge opposite to the first edge, and a third distance between the third edge and the second scribe line is different from the first distance.

17. The method as claimed in claim 16, wherein the third distance is the same as the second distance.

18. The method as claimed in claim 15, wherein the first scribe line has a width that is the same as that of the second scribe line.

19. The method as claimed in claim 14, further comprising:
bonding a third semiconductor die on the first surface of the substrate, wherein a minimum distance between the second semiconductor die and the first edge of the first circuit region is the same as a minimum distance between the third semiconductor die and the first edge of the first circuit region.

20. The method as claimed in claim 19, further comprising:
forming a first conductive wire on the first memory die and the first semiconductor die; and
forming a second conductive wire on the third semiconductor die and the first semiconductor die, wherein the first conductive wire has a length that is the same as that of the second conductive wire.

* * * * *